US008414746B2

(12) United States Patent
Strouse et al.

(10) Patent No.: US 8,414,746 B2
(45) Date of Patent: Apr. 9, 2013

(54) NANOPARTICLE SYNTHESIS AND ASSOCIATED METHODS

(75) Inventors: Geoffrey F. Strouse, Tallahassee, FL (US); Jeffrey A. Gerbec, Goleta, CA (US)

(73) Assignee: Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 11/997,022

(22) PCT Filed: Jul. 27, 2006

(86) PCT No.: PCT/US2006/029100
§ 371 (c)(1),
(2), (4) Date: Jul. 22, 2008

(87) PCT Pub. No.: WO2007/016193
PCT Pub. Date: Feb. 8, 2007

(65) Prior Publication Data
US 2008/0296144 A1    Dec. 4, 2008

(51) Int. Cl.
A62D 3/178    (2007.01)
B01J 19/12    (2006.01)
B82Y 40/00    (2011.01)

(52) U.S. Cl.
USPC ...... 204/157.43; 977/896; 977/895; 977/901; 977/900

(58) Field of Classification Search ............. 204/157.43, 204/157.15; 264/5, 489; 977/883, 896, 900, 977/901
See application file for complete search history.

(56) References Cited

U.S. PATENT DOCUMENTS

| | | | |
|---|---|---|---|
| 5,716,565 A | 2/1998 | Stangle et al. | |
| 6,136,287 A | 10/2000 | Horne et al. | |
| 6,242,723 B1 * | 6/2001 | Lautenschlager | 422/21 |
| 6,576,291 B2 * | 6/2003 | Bawendi et al. | 427/215 |
| 6,607,706 B1 | 8/2003 | Kumar et al. | |
| 6,680,041 B1 | 1/2004 | Kumar et al. | |
| 6,752,979 B1 | 6/2004 | Talbot et al. | |
| 6,884,478 B2 * | 4/2005 | Alivisatos et al. | 428/1.1 |
| 7,615,169 B2 * | 11/2009 | Strouse et al. | 977/840 |
| 2001/0054549 A1 * | 12/2001 | Park et al. | 204/157.43 |
| 2002/0071952 A1 | 6/2002 | Bawendi et al. | |
| 2003/0097976 A1 | 5/2003 | Zehnder et al. | |
| 2003/0108477 A1 * | 6/2003 | Keller et al. | 423/447.1 |
| 2003/0173541 A1 * | 9/2003 | Peng et al. | 252/301.4 R |
| 2004/0009118 A1 | 1/2004 | Phillips et al. | |
| 2004/0022937 A1 * | 2/2004 | Bonitatebus et al. | 427/212 |

(Continued)

OTHER PUBLICATIONS

PCT/IB/373 for PCT/US2006/029100, International Preliminary Report on Patentability, WIPO, Jan. 29, 2008.*

(Continued)

Primary Examiner — Keith Hendricks
Assistant Examiner — Colleen M Raphael
(74) Attorney, Agent, or Firm — Allen, Dyer, Doppelt, Milbrath & Gilchrist, P.A.

(57) ABSTRACT

A method is provided for producing crystalline nanoparticle semiconductor material. The method includes the steps of mixing a precursor in a solvent to form a reaction mixture and subjecting the reaction mixture to microwave dielectric heating at sufficient power to achieve a superheating temperature of the reaction mixture. A growth-phase reaction is permitted to proceed, wherein nanoparticles are formed in the heated reaction mixture. The reaction is then quenched to substantially terminate nanoparticle formation.

23 Claims, 7 Drawing Sheets

U.S. PATENT DOCUMENTS

| | | | | |
|---|---|---|---|---|
| 2004/0178530 | A1* | 9/2004 | Yadav | 264/5 |
| 2004/0202682 | A1* | 10/2004 | Emrick et al. | 424/400 |
| 2006/0060998 | A1 | 3/2006 | Strouse et al. | |
| 2006/0061017 | A1 | 3/2006 | Strouse et al. | |
| 2008/0214386 | A1* | 9/2008 | Takahashi et al. | 502/162 |

OTHER PUBLICATIONS

Atkins, Physical Chemistry 5th Ed. (1994), p. 43 paras. 3 and 4 and pp. 184-185.*

Leadbeater et al, "Microwave-Promoted Organic Synthesis Using Ionic Liquids: A Mini Review," Combinatorial Chemistry & High Throughput Screening, 2004, vol. 7, pp. 511-528.*

Dupont et al, "Transition-Metal Nanoparticles in Imidazolium Ionic Liquids; Recyclable Catalysts for Biphasic Hydrogenation Reactions," J. Am. Chem. Soc. 2002, vol. 124, pp. 4228-4229.*

Harpeness et al, "The microwave-assisted polyol synthesis of nanosized hard magnetic material, FePt," J. Mater. Chem. 2005, vol. 15, pp. 698-702.*

Makhluf et al, "Microwave-assisted synthesis of nanocrystalline MgO and its use as a bacteriocide," Adv. Functional Materials, 2005, vol. 15, pp. 1708-1715.*

Stuerga et al, "Microwave heating as a new way to induce localized enhancements of reaction rate. Non-isothermal and heterogeneous kinetics," Tetrahedron, vol. 52, No. 15, pp. 5505-5510, 1996.*

Sridar, "Microwave radiation as a catalyst for chemical reactions," Current Science, vol. 74, No. 5, Mar. 10, 1998, pp. 446-450.*

Battaglia et al., "Formation of High Quality InP and InAs Nanocrystals in a Noncoordinating Solvent," Nano Letters, vol. 2, No. 9, pp. 1027-1030, Aug. 2002.

Chan et al., "Size-Controlled Growth of CdSe Nanocrystals in Microfluidic Reactors," Nano Letters, vol. 3, No. 2, pp. 199-201, Jan. 2003.

Chiappe et al., "Ionic Liquids: Solvent Properties and Organic Reactivity," J. Phys. Org. Chem., vol. 18, pp. 275-297, Sep. 2004.

Cumberland et al., "Inorganic clusters as Single-Source Precursors for Preparation of CdSe, ZnSe, and CdSe/ZnS Nanomaterials," Chem. Mater., vol. 14, pp. 1576-1584, Mar. 2002.

Ding et al., "Synthesis of HgS and PbS Nanocrystals in a Polyol Solvent by Microwave Heating," Microelectric Engineering, vol. 66, pp. 46-52, Apr. 2003.

Gabriel et al., "Dielectric Parameters Relevant to Microwave Dielectric Heating," Chem. Soc. Rev., vol. 27, pp. 213-223, 1998.

Grisaru et al., "Preparation of the Cd1-xZnxSe Alloys in the Nanophase Form Using Microwave Irradiation," J. Mater. Chem., vol. 12, pp. 339-344, Jan. 2002.

Guzelian et al., "Synthesis of Size-Selected, Surface-Passivated InP Nanocrystals," J. Phys. Chem., vol. 100, pp. 7212-7219, Apr. 1996.

He et al., "Preparation of CdS Nanowires by the Decomposition of the Complex in the Presence of Microwave Irradiation," Journal of Crystal Growth, vol. 240, pp. 389-394, Feb. 2002.

Hong et al., "Synthesis of Carbon Nanotubes Using Microwave Radiation," Adv. Funct. Mater., vol. 13, No. 12, pp. 961-966, Dec. 2003.

Jones et al., "Microwave Heating Applications in Environmental Engineering," Resources, Conservation and Recycling, vol. 34, pp. 75-90, Jan. 2002.

Landry et al., "Synthesis of Chalcopyrite Semiconductors and Their Solid Solutions by Microwave Irradiation," Chem. Mater., vol. 7, pp. 699-706, 1995.

Leadbeater et al., "A Study of the Ionic Liquid Mediated Microwave Heating of Organic Solvents," J. Org. Chem., vol. 67, pp. 3145-3148, Apr. 2002.

Lee et al., "Simple Amphiphilic Liquid Crystalline N-alkylimidazolium Salts. A New Solvent System Providing a Partially Ordered Environment," Chem. Commun., pp. 1911-1912, Aug. 2000.

Li et al., "Large-Scale Synthesis of Nearly Monodisperse CdSe/CdS Core/Shell Nanocrystals Using Air-Stable Reagents via Successive Ion Layer Adsorption and Reaction," J. Am. Chem. Soc., vol. 125, pp. 12567-12575, Sep. 2003.

Lidström et al., "Microwave Assisted Organic Synthesis- A Review," Tetrahedron, vol. 57, pp. 9225-9283, Nov. 2001.

Mekis et al., "One-Pot Synthesis of Highly Luminescent CdSe/CdS Core- Shell Nanocrystals via Organometallic and "Greener" Chemical Approaches," J. Phys. Chem. B, vol. 107, pp. 7454-7462, Jun. 2003.

Mićić et al., "Synthesis and Characterization of InP Quantum Dots," J. Phys. Chem., vol. 98, pp. 4966-4969, May 1994.

Mićić et al., "Synthesis and Characterization of InP, GaP, and GaInP2 Quantum Dots," J. Phys. Chem., vol. 99, pp. 7754-7759, May 1995.

Mićić et al., "Highly Efficient Band-Edge Emission from InP Quantum Dots," Appl. Phys. Lett., vol. 68, No. 22, pp. 3150-3152, May 1996.

Mićić et al., "Synthesis of Extremely Small InP Quantum Dots and Electronic Coupling in Their Disordered Solid Films," Appl. Phys. Lett., vol. 78, No. 25, pp. 4022-4024, Jun. 2001.

Murray et al., "Synthesis and Characterization of Nearly Monodisperse CdE (E = S, Se, Te) Semiconductor Nanocrystallites," J. Am. Chem. Soc., vol. 115, pp. 8706-8715, 1993.

Murugan et al., "Microwave-Solvothermal Synthesis of Nanocrystalline Cadmium Sulfide," Materials Chemistry and Physics, vol. 71, pp. 98-102, Aug. 2001.

Peng et al., "Formation of High-Quality CdTe, CdSe, and CdS Nanocrystals Using CdO as Precursor," J. Am. Chem. Soc., vol. 123, pp. 183-184, Dec. 2000.

Seddon et al., "Influence of Chloride, Water, and Organic Solvents on the Physical Properties of Ionic Liquids," Pure Appl. Chem., vol. 72, No. 12, pp. 2275-2287, Jul. 2000.

Talapin et al., "Etching of Colloidal InP Nanocrystals with Fluorides: Photochemical Nature of the Process Resulting in High Photoluminescence Efficiency," J. Phys. Chem. B, vol. 106, pp. 12659-12663, Nov. 2002.

Talapin et al., "Synthesis and Surface Modification of Amino-Stabilized CdSe, CdTe and InP Nanocrystals," Colloids and Surfaces, vol. 202, pp. 145-154, Apr. 2002.

Thostenson et al., "Microwave Processing: Fundamentals and Applications," Composites: Part A, vol. 30, pp. 1055-1071, Sep. 1999.

Wada et al., "Microwave-Assisted Size Control of CdS Nanocrystallites," J. Mater. Chem., vol. 11, pp. 1936-1940, May 2001.

Wang et al., "Continuous Synthesis of CdSe-ZnS Composite Nanoparticles in a Microfluidic Reactor," Chem. Commun., vol. 1, pp. 48-49, Jan. 2004.

Wells et al., "Synthesis of Nanocrystalline Indium Arsenide and Indium Phosphide from Indium (III) Halides and Tris (trimethylsilyl)pnicogens. Synthesis, Characterization, and Decomposition Behavior of I3In.P(SiMe3)3," Chem. Mater., vol. 7, pp. 793-800, Mar. 1995.

* cited by examiner

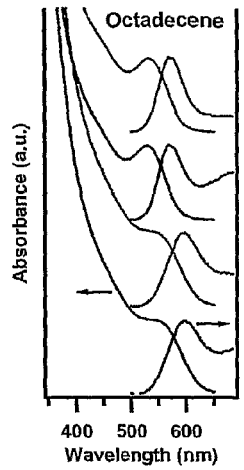
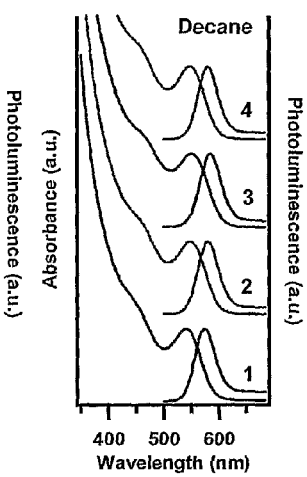
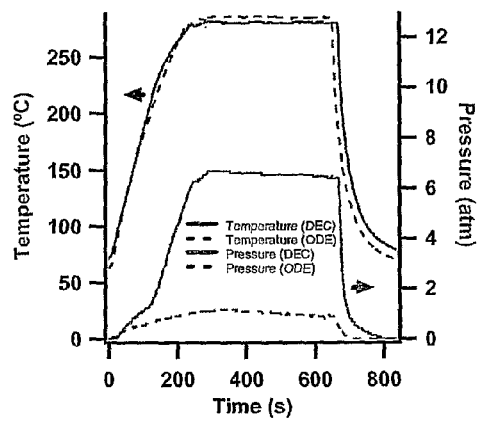
FIG. 4A  FIG. 4B  FIG. 4C
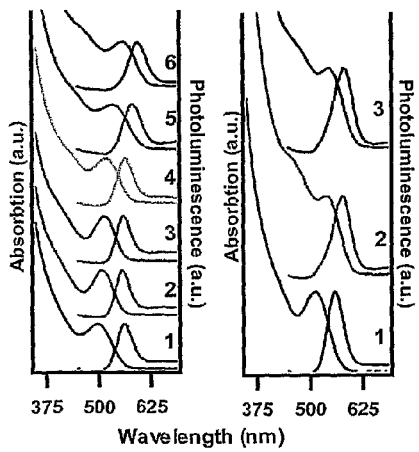
FIG. 5A  FIG. 5B
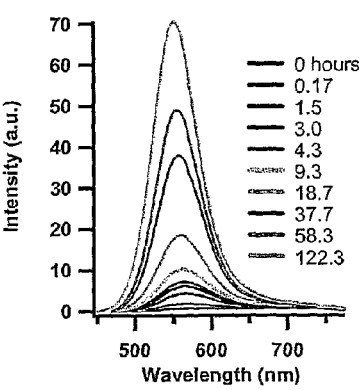
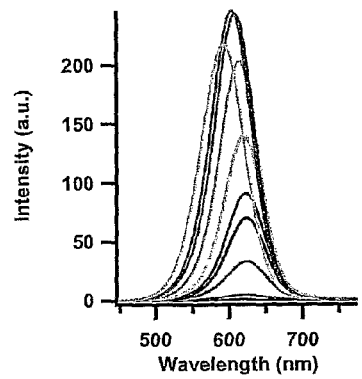
FIG. 6A  FIG. 6B

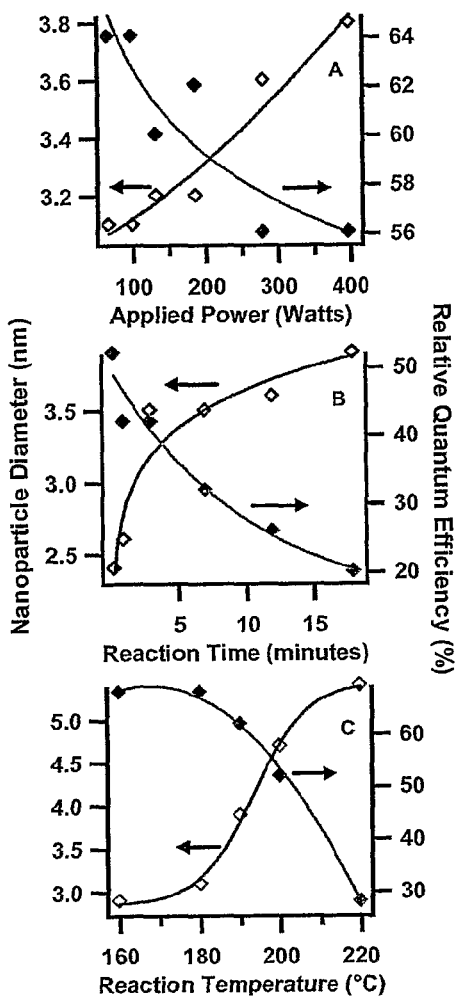
FIG. 11A
FIG. 11B
FIG. 11C
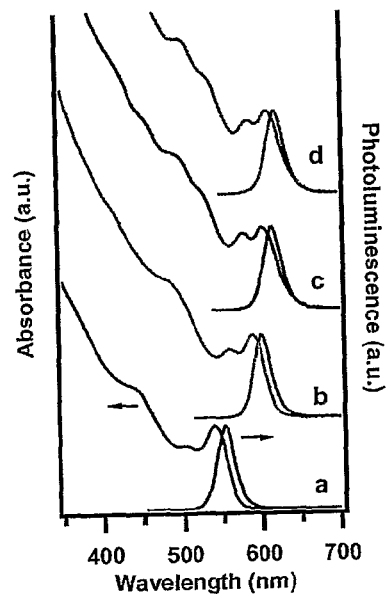
FIG. 12

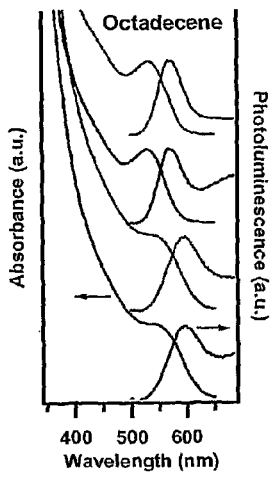 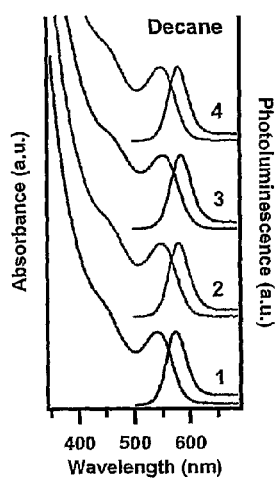 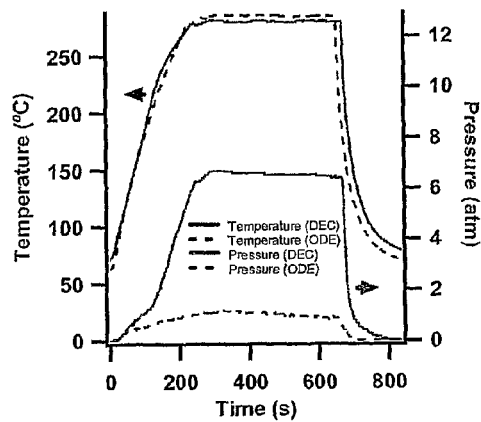
FIG. 13A         FIG. 13B         FIG. 13C
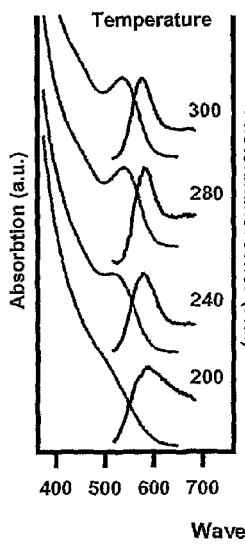 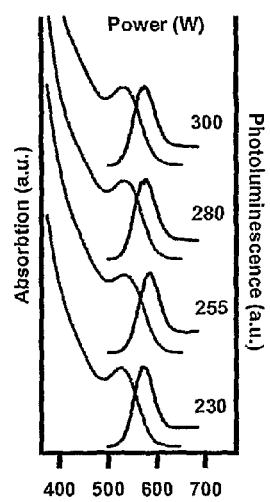 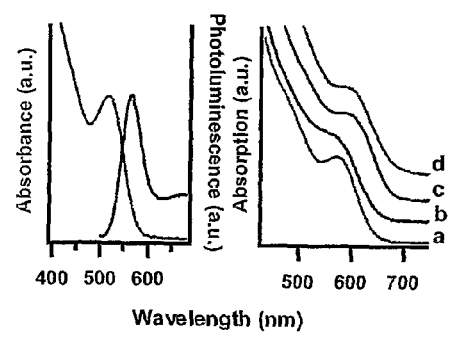
FIG. 14A         FIG. 14B         FIG. 15A         FIG. 15B

NANOPARTICLE SYNTHESIS AND ASSOCIATED METHODS

BACKGROUND OF THE INVENTION

1. Field of the Invention

The present invention relates to systems and methods for synthesizing nanoparticles, and, more particularly, to such systems and methods utilizing microwave energy.

2. Description of Related Art

New applications and technology for nanoscale semiconducting and metallic nanoparticles have grown owing to advancements in the chemical synthetic methodologies for their preparation. These materials are being utilized in applications including as bio-markers, in solar cells, and in lighting technologies, for example. As nanoscale devices become more of a commercial reality, the industrialization of nanoscale materials has been limited by the need for new material compositions and the development of high-throughput automation for materials preparation.

The formation of nanocrystals is notorious for its difficulty and required long reaction times, on the order of hours. Further, for large-scale reactions inhomogeneities in the growth process can be magnified by thermal gradients in the reaction, which produce poor nucleation processes and therefore broadened size distributions. The inhomogeneity of large-scale reactions can be traced, for example, to the inefficient transfer of thermal energy from the heat source.

The growth of nanomaterials is dependent on the thermodynamic and kinetic barriers in the reaction as defined by the reaction trajectory, and is influenced by vacancies, defects, and surface reconstruction events. For the most part, the synthetic methods utilize conventional convective heating owing to the need for high-temperature-initiated nucleation followed by controlled precursor addition to the reaction. Conventional thermal techniques rely on conduction of blackbody radiation to drive the reaction, wherein the reaction vessel acts as an intermediary for energy transfer from the heating mantle to the solvent and finally to the reactant molecules. This can cause sharp thermal gradients throughout the bulk solution and inefficient, non-uniform reaction conditions. This is a common problem encountered in chemical scale-up and is made more problematic in nanomaterials where uniform nucleation and growth rates are critical to material quality.

New approaches for synthesis have been sought, particularly for controlled growth. Recent synthetic advancements have included use of non-solvents and simpler reactants, the use of single-source precursors, and microfluidic reactors. Even household microwave ovens have been used to form nanoparticles, although the resulting crystallinity and the quality of the optical properties appear to be lower in material formed by such systems.

The present inventors have previously demonstrated that microwave heating of organometallic precursors enhances growth of semiconductors, allowing the isolation of large quantities of high-quality photoluminescent semiconducting nanoparticles. The addition of additives and choice of solvent can have a dramatic effect on the observed growth behavior in the microwave by overcoming reaction barriers.

Early findings have indicated that superheating of the solvent and vessel pressurization give rise to a 1000-fold increase in reaction rate. These findings were limited to organic chemical reactions, and had not been applied in the nanocrystal field.

It has also been shown that high-quantum-efficiency CdSe samples could be prepared with quantum yields (QY) on the order of 80%; however, these routes require long reaction times and high-temperature injection.

Therefore, it would be beneficial to provide a scalable, high-efficiency, high-yield process for the production of nanoparticle materials.

SUMMARY OF THE INVENTION

A method is provided for producing crystalline nanoparticle semiconductor material. The method comprises the steps of mixing a precursor in a solvent to form a reaction mixture and subjecting the reaction mixture to microwave dielectric heating at sufficient power to achieve a superheating temperature of the reaction mixture. A growth-phase reaction is permitted to proceed, wherein nanoparticles are formed in the heated reaction mixture. The reaction is then quenched to substantially terminate nanoparticle formation.

In this method, superheated solvents are used to drive reactions to completion by overcoming transition state barriers in the reaction trajectory. Superheating leads to high-pressure and high-temperature reactions that mimic the environment of solid-state reactions in furnaces. The use of supercritical solvents is advantageous in their environmental friendliness, ease of work, and ease of removal, and nanocrystals can be isolated from solution routes that are typically unachievable in solution.

The present invention allows the isolation of large quantities of materials rapidly (<1 min) and is completely scalable for use in a continuous-flow reactor. The ability to produce complex nanomaterials of specified size and shape can be achieved. The invention has been demonstrated for CdSe, InP, InGaP, InN, InGaN, LiZnN, LiZnP, $In_2O_3$ $(In,Ga)_2O_3$, $In_2O_3$, $Ga_2O_3$, nano-diamond, and carbon nanotubes, although these compositions are not intended as limitations.

It is believed that superheating, which results in reaction pressurization and changes in the dielectric constant of the reactants, promotes more efficient annealing at the surface of the nanoparticle, giving rise to larger quantities (>1 kg), higher out-of-batch quantum efficiencies (QE>70%), greater crystallinity, more rapid growth (<1 m), and ease of isolation of nanocrystals from alkane solvents (hexane, heptane, octane, nonane, decane, dodecane, etc.). The lower-boiling-point solvents allow larger nanocrystals to be generated. In addition, shape control (rods, spheres, tetrapods) has been demonstrated depending on the nature of the starting materials or additives. The invention is believed to mimic the bulk semiconductor growth conditions where metallic salts are heated to temperatures in excess of 1000° C.

Microwave heating of group-12 and -13 organometallic precursors and group-15 and -16 reactants has demonstrated that dielectric heating is a viable method for the preparation of high-quality photoluminescent semiconducting nanoparticles. Additives, for example, tri-octyl phosphine oxide (TOPO) or ionic liquids, can have a dramatic effect on the observed growth behavior in the microwave. Increasing microwave power increases the reaction rate and material quality owing to overcoming kinetic barriers. This is believed to represent a significant step towards the commercial availability of III-V phosphors.

The present invention indicates that multiple sizes of CdSe and the more delicate III-V colloidal semiconductor nanoparticles can be rapidly synthesized in a closed system by microwave-assisted synthesis in less than 20 min with no sacrifice to the structure or optical quality. This method can be tailored to existing synthetic routes utilizing high-boiling solvents. It is also shown that the formation rate and optical properties are dramatically enhanced when the boiling point of the solvent is reduced from octadecene (ODE) to decane in the case of InGaP, which creates a superheated reaction mixture.

Because the reactions are intrinsically heated, there is an inside-out thermal transfer; so the microscopic temperature substantially instantly rises when the microwave field is applied. The implication is that the internal temperature of the reaction at or near the nanoparticle surface is significantly higher than that which is detected by the infrared detector, which ultimately reads the vessel temperature. In addition, when active cooling is employed, the latent heat is removed from the bulk solution, promoting a higher power density to be applied to the reactants elevating the microscopic temperature even higher. This observation may promote more efficient annealing at the surface of the nanoparticle, giving rise to the higher out of batch quantum efficiencies in the III-V synthesis in decane. This environment mimics the bulk semiconductor growth conditions where metallic salts are heated to temperatures in excess of 1000° C.

This synthetic strategy can be tailored to a host of nanomaterials to enhance the efficiency of the nanomaterial discovery and the optimization of nanostructured materials. Moreover, the III-V nanomaterials and the harsh environment and high temperatures needed for growth is no longer a limiting factor governing industrial scalability of such materials. The ability to control the reaction with microwaves offers a more environmentally friendly approach to nanostructured materials. The demonstration of microwave techniques effectively automates the synthetic process, and demonstrates the use of a continuous-flow microwave reactor for nanoparticle formation.

Size tunability in InGaP is also demonstrated, with the addition of a co-solvent to the reaction mixture. Photoetching of InGaP is also described.

The features that characterize the invention, both as to organization and method of operation, together with further objects and advantages thereof, will be better understood from the following description used in conjunction with the accompanying drawing. It is to be expressly understood that the drawing is for the purpose of illustration and description and is not intended as a definition of the limits of the invention. These and other objects attained, and advantages offered, by the present invention will become more fully apparent as the description that now follows is read in conjunction with the accompanying drawing.

BRIEF DESCRIPTION OF THE DRAWINGS

FIGS. 4A-4C illustrate the growth characteristics of InGaP at 280° C. and 280 W in (FIG. 4A) a high-boiling non-coordinating solvent, octadecene, and (FIG. 4B) a low-boiling decane. The reactions times in both solvents were (1) 30 sec, (2) 1 min, (3) 3 min, and (4) 7 min. FIG. 4C shows temperature and pressure profiles of the reaction consisting of the high-boiling, ODE, and low-boiling, decane, non-coordinating solvents.

FIGS. 5A and 5B illustrate the formation of InGaP in a microwave device at 280 W and 280° C. The co-solvent in FIG. 5A is either tri-octyl phosphine (1-3) at various concentrations or tri-octyl amine (5-6) at various concentrations. FIG. 5B represents multiple injections in the microwave device, which increases the size with each injection of precursor.

FIG. 6A shows time-dependent etching on InP.

FIG. 6B shows etching of InGaP for the samples at various times.

FIGS. 11A-11C illustrate nanoparticle diameter and quantum efficiency (QY) of CdSe synthesized at (FIG. 11A) various power levels (W) at 3 min and 210° C., (FIG. 11B) various times (min) at 100 W and 220° C., and (FIG. 11C) various temperatures for 10 min at 220 W.

FIG. 12 illustrates the absorption and photoluminescence in toluene of CdSe prepared in the microwave by CdO in hexadecylamine and triotylphosphine oxide. The reactions were carried out at (a) 200° C., (b) 240° C., (c) 280° C., and (d) 300° C. for 30 s at 160 W to achieve different sizes. No active cooling was applied.

FIGS. 13A-13C illustrate the growth characteristics of InGaP at 280° C. and 280 W in (FIG. 13A) a high-boiling non-coordinating solvent ODE and (FIG. 13B) a low-boiling solvent decane. The reaction time in both solvents was (1) 30 s, (2) 1 min, (3) 3 min, and (4) 7 min. FIG. 13C shows the temperature (° C.) and pressure profiles (atm) of the reaction consisting of the high-boiling ODE and low-boiling decane, non-coordinating solvents.

FIGS. 14A,14B plot absorption and photoluminescence (350 nm excitation wavelength) with variable temperature (FIG. 14A, 280 W, 7 min) and power levels (FIG. 14B, 280° C., 7 min) for optimizing the synthesis of InGaP nanocrystals. The data were taken in toluene at room temperature.

FIGS. 15A,15B illustrate absorbance and photoluminescence (FIG. 15A) and absorption (FIG. 15B) of InP in toluene. Absorbance of a series of InP nanoparticles formed in the presence of ionic liquids at 280° C. for 15 min at 280 W: (a) as-prepared InP nanoparticles with no ionic liquid present, (b) InP with trihexyltetradecylphosphonium decanoate, (c) InP with trihexyltetradecylphosphonium bromide, (d) InP with trioctylphosphine oxide.

DETAILED DESCRIPTION OF THE PREFERRED EMBODIMENTS

Figure 1:
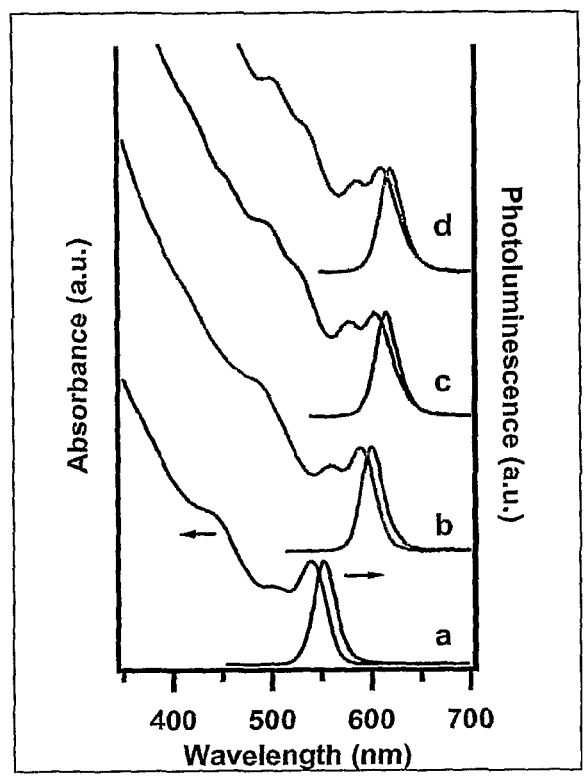
FIG. 1 plots absorption and photoluminescence in toluene of CdSe prepared in a microwave device by CdO in hexadecylamine and TOPO. The reactions were carried out at (a) 200° C., (b) 240° C., (c) 280° C., (d) 300° C. for 30 sec at 160 W to achieve different sized particles. No active cooling was applied.

A description of the preferred embodiments of the present invention will now be presented with reference to FIGS. 1-15B.

The method of the present invention demonstrates that microwave heating methods can address the problem of heating inhomogeneity in forming nanoparticle materials, while providing a scalable platform for industrial applications. Microwave heating has been demonstrated to enhance reaction rates, selectivity, and product yields in organic chemistry. By judicious choice of the solvents, passivating ligands, and reactants, the nanomaterial precursors can be selectively heated over the solvent or passivating ligand. Selective heating in the microwave cavity is advantageous in organic synthesis, and in general these microwave synthetic methodologies are quite adaptable to reactions that have high energies of activation and slow reaction rates. This effect confers advantages for colloidal nanostructured materials synthesis.

The present invention is directed to microwave synthetic methodology and the influence of additives for a range of organically passivated binary and ternary III-V (InGaP, InP) and II-VI (CdSe) materials. The nanomaterials are reproducibly prepared in less than 20 min in a focused 2.45 GHz, single-mode high-power microwave (300-400 W/cm$^2$) capable of operating at 300° C. for extended reaction times. The prepared materials are crystalline, with a size distribution of 5-6%, and are substantially spherical in shape. The power, temperature, time, and additive-dependent growth have been studied.

Microwave chemistry appears to enhance reaction rates either by overcoming local intermediates that act as traps along the reaction trajectory or by increasing the microscopic reaction temperature of the reaction. The difference in the effect of additives and the microwave variables (temperature, time, and power) for the II-VI and III-V materials suggests that local intermediates and transition states in the reaction trajectory are substantially different. The III-V materials show no time-, temperature-, or power-dependent growth in the microwave; however, when the typical high-boiling non-coordinating solvent ODE is replaced with a low-boiling solvent, decane, the colloidal size distribution is significantly narrowed and the quantum efficiencies are increased (QY=15%), presumably owing to increase reaction pressures that may anneal out vacancy or defects in the forming nanocrystals. CdSe growth and properties are dependent on the addition of ionic liquids, as well as reaction temperature in concert with the applied microwave power and reaction time.

The reactants (Aldrich Chemical) were used without further purification. Decane was purified previously by distillation over activated 4 A molecular sieves. Isolation of all nanomaterials is achieved under an Ar atmosphere by dissolution of the room temperature reaction mixture in a minimum of toluene, addition of a 2:1 anhydrous butanol/methanol solution to induce particle precipitation, and collection of the solid via centrifugation. The process is preferably repeated three times to remove unwanted reactants. All glassware was dried prior to use.

Microwave nanoparticle synthesis was carried out in a modified CEM Discover microwave using single-mode and continuous power 2.45 GHz. Although the reactions can be carried out in any microwave device, reaction temperature, microwave power, and mode quality are important in producing the highest structural, size uniformity, and optical quality. The CEM microwave cavity was commercially modified by CEM with a Teflon insert to allow sustainable heating at 300° C. at powers up to 400 W.

Each exemplary reaction was carried out in a sealed reaction vessel with 5 ml of the respective starting solution. To maintain stable power and temperature during the reaction, the microwave cavity was actively cooled by compressed air to remove latent heat from the reaction. Active cooling via compressed air allows higher power levels to be applied without increasing the reaction temperature. It should be noted that the use of compressed air results in thermal gradients from the reaction vessel inwards toward the reaction center. Reaction temperatures are measured at the vessel wall in the microwave, which will mean that the actual microscopic reaction temperature is not measured; rather the average vessel temperature is reported.

Initiation of the reaction is carried out at maximum power to achieve a desired reaction temperature as rapidly as possible. During the growth phase for nanocrystal chemistry the power and reaction temperature were varied to maximize the quality of the individual materials as measured by transmission electron microscopy (TEM), powder X-ray diffraction (pXRD), and optical absorption and fluorescence. The results of the growth-phase studies suggest the temperature and power parameters are unique to the material type, but dictate material quality in the microwave reactions for all nanomaterials studied.

Preparation of CdSe by $Li_4[Cd_{10}Se_4(SPh)_{16}]$. CdSe was prepared using the single-source precursor $Li_4[Cd_{10}Se_4(SPh)_{16}]$. The additive study with added ionic liquid was carried out using a stock solution of the precursor cluster prepared by adding 635 mg of $Li_4[Cd_{10}Se_4(SPh)_{16}]$ and 0.0448 g of 1-hexyl-3-methylimidazolium chloride to 45 g of degassed 1-aminohexadecane at 90° C. The solution was degassed under Ar, and ml aliquots were injected into the microwave reaction vials prior to the reaction. Sample quality for all reactions was monitored by absorption spectroscopy, photoluminescence (PL), and pXRD.

Preparation of CdSe by CdO. In order to investigate other reactions and the effect of a strong microwave absorber (TOPO), the microwave studies were carried out using CdO and TBPSe as precursors. The Cd and Se precursors were prepared in a mixture of 50:50 (w:w) 1-amino hexadecane (HDA) and TOPO as the solvent. The Se precursor was injected into the Cd solution at 50° C. and mixed for 15 min. The solution was maintained at 50° C. to allow the reactants to remain in the liquid state for transfer into the microwave reaction vials. The ramping power was set to 300 W until the desired reaction temperature was reached. At this time active cooling was employed to maintain a high power density at 280 W for the duration of the reaction. Each reaction time consisted of a duration of 30 sec. The ramping period ranged from 30 sec to 1 min depending on the reaction temperature. Sample quality for all reactions was monitored by absorption spectroscopy, PL, and pXRD.

MW methods can make the synthesis of these materials industrially practical if the QYs are realizable. The reaction here is introduced into the microwave at RT, wherein the reaction affords an extremely rapid temperature increase owing to the high dielectric constant of TOPO. FIG. 1 illustrates that temperature-dependent sizes of CdSe nanoparticles can be isolated within 30 sec. These materials have incredibly narrow excitonic features, indicating size distributions below 5%. Likewise, it is clearly observed in the PL that a very narrow size distribution is maintained for all sizes with no PL defect emission. The size distribution of these 30-sec reactions is comparable to thermally prepared material reported in the literature with comparable quantum efficiencies of 0.74 measured against thermally grown material (QY=0.85) by literature methods. An interesting aspect is the size distribution remains substantially constant for all the sizes.

Preparation of InGaP in Octadecene. The preparation of InGaP is based on a modification of literature methods. The In and Ga intermediates were prepared by mixing 2.71 mmol indium (III) acetate and 0.271 mmol of gallium (III) 2,4-pentanedionate and 8.94 mmol hexadecanoic acid with 190 ml of ODE in a three-neck flask. The cation intermediates were formed by heating the solution to 110° C. under vacuum for two hours with four cycles of Ar backfilling. The temperature of the solution was allowed to cool to 50° C., at which time 1.50 mmol of tris(trimethylsilyl)phosphine (TMSP) was injected. The In/Ga/P precursor solution immediately turned from colorless to yellow. The In/Ga/P precursor solution was kept under Ar at 50° C. as a stock solution for later use. For a typical reaction, 5 ml of the stock solution was removed by Teflon syringe and placed in a reaction tube (CEM Corporation). The ramp period was set to 300 W to achieve the reaction temperature in the least amount of time.

Figure 2:
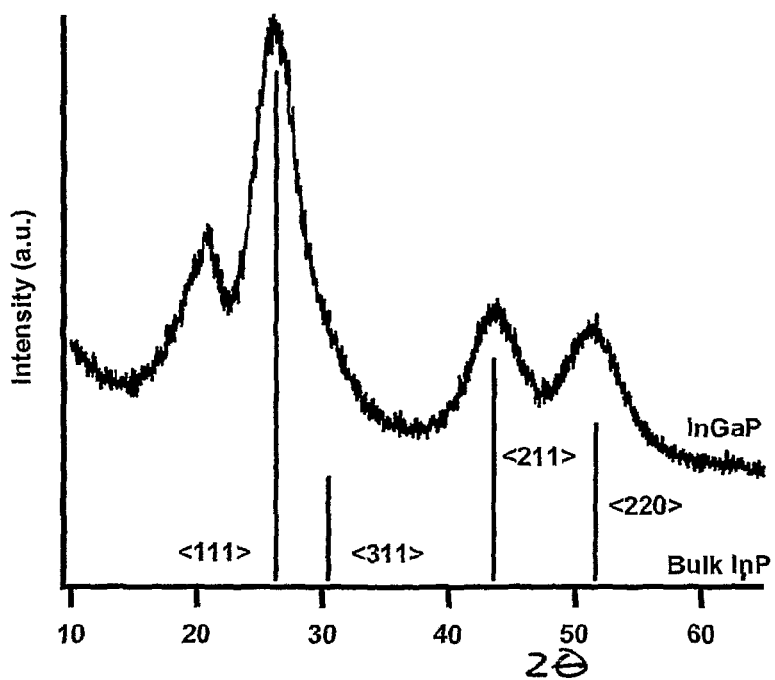
FIG. 2 is a plot of powder X-ray diffraction intensity of InGaP nanoparticles with angle.
Figure 3A:
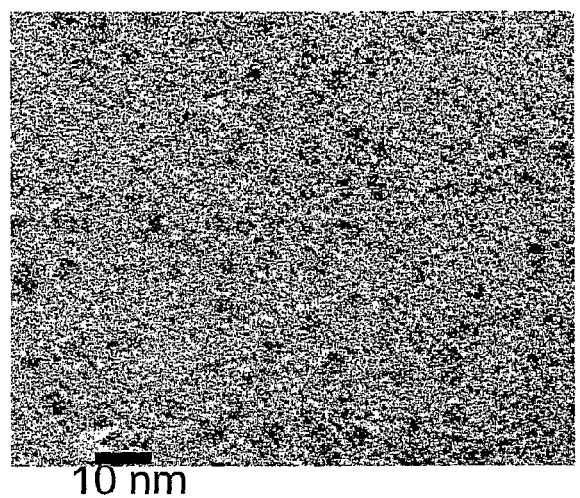
FIGS. 3A and 3B are transmission electron micrograph images of InGaP nanoparticles synthesized at 280° C. for 7 min at 280 W.
Figure 3B:
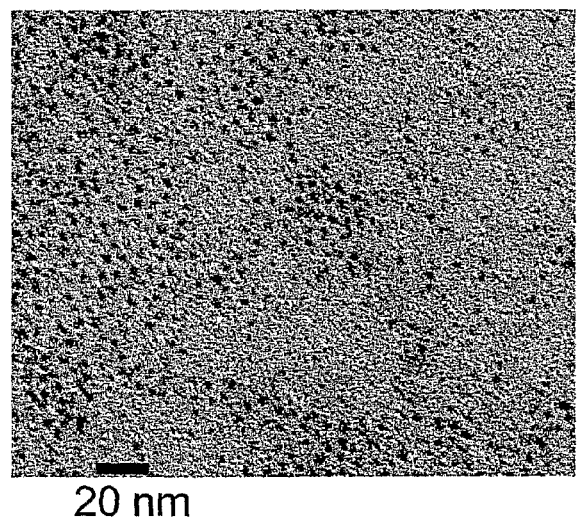

Once the desired reaction temperature was reached, active cooling was employed by stabilizing the power at 280 W by applying compressed air (~3-7 psi) to the reaction vessel. When the reaction was complete, the power was reduced to 0 W, and the compressed air flow was increased to 70 psi for maximum cooling. Sample quality for all reactions was monitored by absorption spectroscopy, PL, and pXRD (FIG. 2). In addition, TEM was measured on the InGaP samples to measure their shape and crystallinity (FIGS. 3A and 3B).

In FIG. 4A are illustrated the growth characteristics of InGaP at 280° C. and 280 W in a high-boiling non-coordinating solvent, ODE. The reactions times were (1) 30 sec, (2) 1 min, (3) 3 min, and (4) 7 min. FIG. 4C shows temperature and pressure profiles of the reaction consisting of the high-boiling ODE non-coordinating solvent.

Preparation of InGaP in Decane. The reaction stoichiometry and method in decane is substantially identical to the reaction in ODE. The preparation of the cations consisted of placing 710 μmol indium (III) acetate and 74.1 μmol of gallium (III) 2,4-pentanedionate and 2.36 mmol hexadecanoic acid in a three neck flask. The cations (In/Ga) were prepared in the absence of the non-coordinating solvent due to its low boiling point (174° C.). This was achieved by heating the salts to 150° C. under reduced pressure. The melt was clear and colorless and was backfilled with Ar four times at this temperature. The reactants were allowed to cool to room temperature, at which time 50.0 ml of decane was injected into flask under inert conditions. The temperature was raised to 50° C. to afford a clear and colorless solution, at which time 393 μmol of tris(trimethylsilyl)phosphine was injected. The solution slowly turned pale yellow over a 30 min period. 5 ml of the stock solution was placed in microwave reaction tubes and immediately placed in the microwave chamber for various reaction times (from 30 sec to 7 min) at 280° C. with a stable power at 280 W by active cooling. The ramping and cooling parameters were identical to the InGaP prepared in octadecene. Sample quality for all reactions was monitored by absorption spectroscopy, PL, and pXRD.

FIG. 4B illustrates the growth characteristics of InGaP at 280° C. and 280 W in a low-boiling decane. The reactions times were (1) 30 sec. (2) 1 min, (3) 3 min, and (4) 7 min. As mentioned above, FIG. 4C shows temperature and pressure profiles of the reaction consisting of the high-boiling, ODS, and low-boiling, decane, non-coordinating solvents.

Comparison of InGaP Growth in ODE and Decane. The formation of InGaP in ODE shows a focusing of size distribution from 30 sec to 7 min. At 7 min, the size distribution and PL are maximized, when the applied power is 280 W and the reaction temperature is 280° C. The onset of the first exciton and the quality of the PL becomes more resolved, but no shift in the position of the excitonic feature is observed. When these formation characteristics are compared with the same reaction conditions, but replacing the solvent with decane, the difference is quite astonishing. It is clear that the size distribution becomes focused around 1 min and remains constant up to 7 min. The absorption features are much more resolved.

The PL quantum efficiency of the as-prepared (unetched) InGaP ranges from 0.09 for a 30 sec reaction to 0.15 for a 7 min reaction. It is believed that this is the first report of quantum efficiencies of an as-prepared, un-size-selected, III-V system that exhibits quantum efficiencies of this magnitude. The surface appears to undergo an annealing period between 1 and 7 min. Comparing the formation rate of InGaP in ODE and decane, it is apparent that the rate is dramatically enhanced in decane. The reaction rate increase has been observed in other types of synthesis where a 1000-fold increase of the reaction rate has been observed under superheated microwave conditions. It has also been observed that when the polarity of the solvent is decreased (i.e., when the solvent becomes more transparent) for some synthesis, the observed reaction rate and product yield increase. This implies that there is a stronger microwave-material interaction in the more transparent solvents giving rise to microwave-specific effects. This is clearly observed in this example.

In contrast to the material formed in ODE, decane appears to promote a stronger coupling of the microwave-nanomaterial interaction. This is seen in the superheated form of decane compared with that of ODE. When the reaction containing decane approaches 200° C., the pressure increases rapidly until it is sustained at 6.2 atm for the duration of the reaction. It is observed from both reactions in ODE and decane that there is a rise in pressure at the onset of the reaction, suggesting that there is a volatile byproduct that is liberated as the nanoparticle reaches its maximum size. This is possibly a low-boiling organic that diffuses back into solution when the reaction is cooled.

Size Tunability and Photoetching of InGaP. Data have also been obtained for InGaP that demonstrate size tunability (FIGS. 5A,5B). The change in the growth rate appears to be correlated with surface stabilization and the participation of Ga as a flux element.

Data are also presented on the photoetching of InGaP (FIGS. 6A,6B). These high-quantum-efficiency materials show an amazing improvement in PL following treatment with 1% HF in MeOH under UV-photolysis. While photoassisted etching has been observed for InP, the magnitude of the PL enhancement in InGaP is believed significant. FIG. 6A shows time-dependent etching on InP, and FIG. 6B shows etching of InGaP for the samples at various times.

Preparation of InP in Octadecene. The InP nanomaterials were prepared in the same manner as InGaP prepared in octadecene, keeping the cation:anion mol ratio 2:1 and the cation:ligand mol ratio at 1:3, and maintained at 50° C. under Ar. 78.5 μmol of 1-hexyl-3-methylimidazolium chloride, trihexyltetradecylphosphonium decanoate, and trihexyltetradecylphosphonium bromide were massed into separate microwave reaction vials inside an Ar-filled dry box and sealed to later be taken into a fume hood. 5 ml of the InP stock solution was injected into the microwave reaction tubes prior to each reaction. Sample quality for all reactions was monitored by absorption spectroscopy, PL, and pXRD.

Results. Microwave chemistry takes advantage of the selective nature of microwave heating for materials that have high dielectric losses, namely, polar systems. Dielectric heating, in contrast to convective heating, heats the total volume of the reactants by transferring energy selectively to microwave absorbing materials. The larger the microwave cross-section for a particular constituent, the more dramatic the heating process is. It can therefore be imagined that the intrinsic temperature localized around the ions is significantly higher in temperature than that of the bulk solution. Owing to the fact that precursors and intermediates along a given reaction trajectory can have different dielectric constants, microwaves can be used to overcome high activation energies for product formation by selectively coupling to intermediates in the transition states.

In organic chemistry the better understanding of the reaction trajectories leads to the so-called "specific microwave effect" to systematically manipulate the products generated from a given reaction. In organic reactions, the nature of the selective heating of microwave absorbing materials therefore allows both rapid heating rates and high temperatures to be reached, which in turn drives chemical reactions. In addition, it is established that volumetric heating with microwaves reduces the overall thermal gradients in the reaction, producing a more uniform product formation.

For nanocrystal growth the higher reaction temperatures, greater thermal control, and lower thermal gradients are needed to produce high-quality materials. If the inorganic precursor or the forming nanoparticle has a higher cross-section for microwave absorption relative to the reaction solvent, higher reaction temperatures will be achieved in comparison to convective heating with the solvent acting as a thermal mediator absorbing energy from the reactants rather than transferring the heat to the reaction. This suggests that, if the nanoparticle or intermediates are selectively heated relative to the solvent, the temperature of the reaction in the microwave, measured at the vessel and/or solvent, can be potentially much higher. This provides enhanced control over the reactions by providing temperature, time, microwave power, and absorption cross-section as mediators for materials synthesis.

Figure 7:
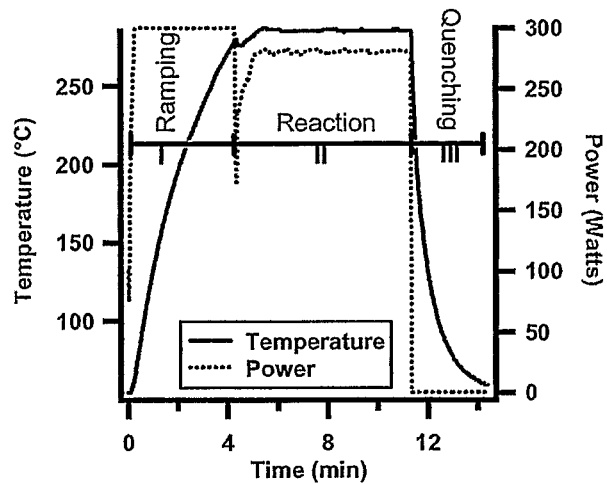
FIG. 7 is a temperature/power profile of an InGaP reaction.

FIG. 7 illustrates a typical reaction trajectory for a nanomaterial grown in a non-polar solvent. The microwave reaction can be divided into three reaction stages: temperature ramping or instantaneous heating to initiate nucleation, carried out at 300 W until a desired temperature is reached, here, 280° C.; a growth regime manipulated by reaction time and temperature, wherein the power and temperature are maintained at 280 W and 280° C., respectively; and a rapid thermal quenching step using compressed air to control Ostwald ripening (reaction termination).

In the microwave device, the nucleation process is achieved by rapidly increasing the temperature from room temperature (RT) to 280° C. at full microwave power (300-400 W). During the growth phase the power is reduced to maintain a controlled growth stage. The temperature of the reaction is held constant by active cooling of the reaction vessel with forced air to allow power and temperature to be controlled independently. The drawback of active cooling is thermal gradients may be higher than measured. Active cooling carries latent heat away from the vessel during the reaction to stabilize the applied power at a given reaction temperature allowing a high power density to be applied to the reaction constituents. In this case it is probable that there is an inside-out thermal gradient in which the highest temperature is found near the center of the solution.

Reaction times are based upon the time at a desired temperature and are chosen according to the desired reaction and nanomaterial size. Once the reaction is complete, the microwave power is turned off to terminate the reaction and the airflow is increased to rapidly cool the solution, quenching the reaction, which minimizes colloidal size distributions resulting form Ostwald ripening. All three stages in the microwave are important in the formation of a narrow size distribution of colloids with high optical quality, as measured by absorption and photoluminescence and will be discussed separately below.

Initiation Phase. The quality of the final nanomaterials is dependent on the initiation of the reaction. It has been suggested that uniformity in heating, introduction of the precursor, and controlled temperature over the course of the reaction are important to final product quality. In standard lyothermal synthetic methods, this tends to be achieved by rapid injection of the precursors at high temperature, with the solvent acting to provide the convective heat. To eliminate out-of-control growth in the lyothermal synthesis, the innate cooling of the reaction upon injection of a cold reactant controls the growth phase, although reactant concentration and activity are also important. In the microwave, nanoparticle formation and growth may be initiated by selective microwave heating of constituents in the reaction. The selective heating can either be to the precursors or to an organic constituent in the reaction, depending on the reaction type. In either case the local temperature is escalated and forms a uniform thermal field free of gradients. This in turn provides energy to drive the desired product by overcoming transition states in the reaction trajectory. Unfortunately, while in organic chemistry the microwave-dependent effects can be specifically discussed in terms of the reaction trajectory, the lack of an in-depth mechanistic picture for nanoparticle growth makes determination of the exact influence of the microwave on the transition states for nanoparticle formation difficult.

The influence on the product formation under microwave heating can depend on the applied microwave power (P) and the competitive microwave cross-section of the reactants and passivants in solution, as measured by the heating rate. This of course is dependent on the microwave cavity design, but the general observations are likely relevant to all designs. The heating rate (dT/dt) in a microwave reactor correlates with the real ($\in'$) and imaginary ($\in''$) components of the complex dielectric constant ($\in^*$) for the individual components in the reaction mixtures. The microwave absorption cross-section is described by the real component, while the ability to transfer microwave energy into heat is described by the loss tangent (tan $\delta = \in''/\in'$). Molecules with large permanent dipoles absorb microwave irradiation selectively over molecules with small dipoles. The magnitude of the microwave absorption cross-section is therefore dependent on the materials dielectric constant or permittivity ($\in'$). This value tends to be small for non-polar organic moieties (~2.0 for benzylic molecules) and values of up to 80 for water.

Since selective heating in the microwave device requires a large dipole, the rate of heating of the reactants in an applied electric field (E) is described by Eq. (1):

$$dT/dt = \sigma[E]^2/\rho C \qquad (1)$$

where $\rho$ is the density and C is the specific heat capacity of the molecule, and the molecular conductivity ($\sigma$) is related to the imaginary part ($\in''$) of the permittivity function using a Debye relationship, $\in^* = \in' + i\in''$. In general the value of E is dependent on the cavity design, and is therefore not calculable; however, the expression indicates that initiation of the nanomaterial reaction is controllable by the dielectric constant of the reactants and therefore the heating rate of the reaction. The temperature ramping depends on the ability of each of the constituent elements in the reaction to absorb microwaves ($\in$) and the solvent thermal conductivity.

The element in the reaction mixture that couples with the microwaves the most strongly will give rise to the major component of the heat transfer. If the element is a transition-state intermediate along the reaction path, it can assist in product formation. If the element is a polar or ionic species, including organic salts or ionic liquids, not involved in the transition states, it contributes to an average increase in the overall reaction temperatures, which can also be advantageous.

Figure 8A:
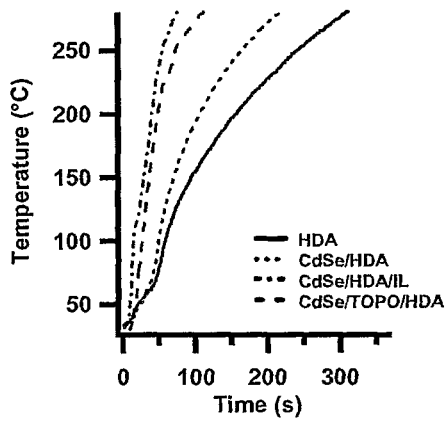
FIGS. 8A and 8B illustrate temperature ramping rates for molecular precursors and solvents used in the formation of (FIG. 8A) CdSe at 400 W and (FIG. 8B) III-V nanoparticles at 300 W.
Figure 8B:
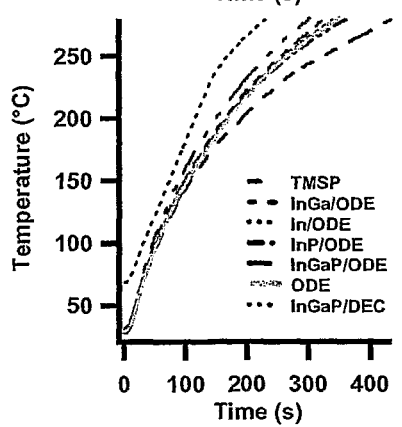

In the microwave device, interpretation of heating rates is complicated by the fact that the temperature is measured at the reaction vessel and is not a direct reflection of the microscopic reaction temperature. Inspection of the rates does provide insight into the effects of additives to reactions and therefore can provide insight into how to control reaction trajectories. In FIGS. 8A and 8B, the effect of solvent and reactant choice on reaction heating rates is illustrated for a series of reactions for CdSe at 400 W, and InP and InGaP at 300 W.

In FIG. 8A, HDA represents 5 ml of hexadecylamine, the curve for CdSe/HDA is for a solution containing $Li_4[Cd_{10}Se_4(SPh)_{16}]$ dissolved in HDA, the curve CdSe/HDA/IL represents a solution containing $Li_4[Cd_{10}Se_4(SPh)_{16}]$ in HDA with the ionic liquid (IL) 1-hexyl-3-methylimidazolium chloride added, and the curve for TOPO/HDA/CdO is for a 50:50 v:v mixture of the solvents with CdO and TBPSe added. In FIG. 8B, TMSP represents a solution containing tris(trimethylsilyl)phosphine in octadecene; In/ODE and InGa/ODE represent solutions containing the metal salts in a mixture of hexadecanoic acid and ODE; InP/ODE and InGaP/ODE represent identical solutions with TMSP added. The curve for ODE is for 5 ml of technical-grade octadecene.

In the CdSe reactions, it is clear in FIG. 8A the heating rates for the reactions with CdSe/HDA/IL (12° C./s) and with TOPO/HDA/CdO (9° C./s) are enhanced relative to heating pure HDA (3° C./s) or the reaction CdSe/HDA (4° C./s). The deviation at 62° C. for the HDA and CdSe/HDA curves in FIG. 8A arise from melting of the HDA (1-aminohexadecane). Upon addition of the ionic liquid 1-hexyl-3-methylimidazolium chloride, the heating rate of the solution increases dramatically owing to the large microwave cross-section for ionic liquids, as previously observed in microwave-driven reactions. Likewise, the large heating rate for TOPO/CdO is due to the high absorption cross-section for TOPO. The effect of the ionic liquid and TOPO to rapidly heat the bulk solution can be traced back to their selective ability to couple with the microwaves and efficiently convert electromagnetic energy into heat. The effect of the higher heating rate in the presence of the ionic liquids is to increase the microscopic reaction temperatures of the reaction. In turn these accelerated heating rates translate to rapid particle growth, as discussed below.

The effect of reaction conditions on heating rates in the formation of InP and InGaP are less conclusive and are shown in FIG. 4B. The rate of heating for the InP and InGaP reactions in ODE and decane are slow, 2° C./s. The largely invariant heating rates observed for the different reaction conditions is not surprising when considering that the polarizability of the group III precursors is small and the precursor concentration is low in solution. The observation that octadecene (ODE) and decane show identical heating rates of 2° C./s to the InP and InGaP reactions suggest that only the solvent is absorbing the microwave (MW) energy. However, this assumption may be incorrect, since the actual microscopic temperature of the reaction may be substantially higher than measured. The measured rate of solvent heating in FIGS. 4A,4B is dictated by solvent thermal conductivity and thermal load on the solvent. In the case of nanoparticle growth without added ILs, the thermal load is likely to be small, since the nanoparticles should thermalize rapidly due to their small size and exist in low concentration.

Growth Phase. During the growth phase for nanomaterials uniform volumetric heating is important to maintain the size focus. In the microwave device, the reaction temperature is achieved by uniform volumetric heating, which is influenced by the power dissipation to the solvent and the applied power. The dissipation of power per unit volume (P) is described by $P=\sigma[E]^2$, where $\sigma$ is the conductivity and E is the applied electric field. The applied power influences the temperature of the reaction solution. The temperature of the reaction is mediated by thermal transfer of latent heat from the reactant to the solvent and dissipation by active air-cooling in the microwave. Excess heat will tend to drive Ostwald ripening processes in nanomaterial synthesis.

CdSe Nanoparticle Formation. The growth of CdSe nanoparticles is an ideal platform to compare the quality and the rate of growth for nanoparticles grown by convective heating and microwave heating methods. The influence of additives on the growth of CdSe from a single-source precursor route using $Li_4[Cd_{10}Se_4(SPh)_{16}]$ and added ionic liquids and the effect of having a solvent that is a strong microwave absorber (TOPO) using a CdO method have been studied. The prepared materials, whether grown convectively or by dielectric heating, are substantially identical, with similar absorption features, photoluminescence quantum yields, and similar size dispersities for a given reaction methodology. Significant differences exist between convective and dielectric heating in regards to material handling, where the reactants can be added at room temperature without the need for high-temperature injection to produce high-quality materials; material growth, where the growth times even for III-V materials is under 15 min; and in increased reproducibility from reaction batch to reaction batch.

Figures 9A, 9B:
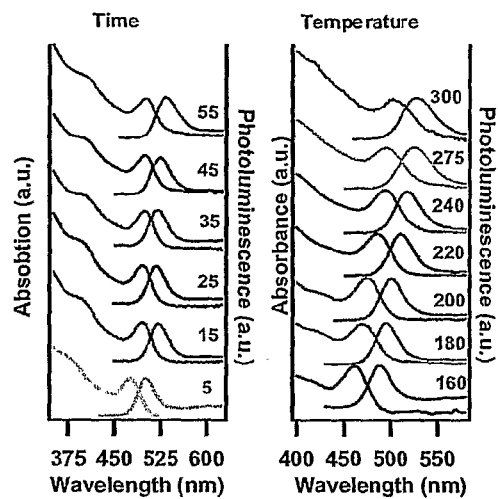
FIGS. 9A-9C plot room temperature absorption and photoluminescence of toluene isolated CdSe nanoparticles grown from $Li_4[Cd_{10}Se_4(SPh)_{16}]$ synthesized at various (FIG. 9A) power (W), (FIG. 9B) time (min), and (FIG. 9C) temperature (° C.).
Figure 9C:
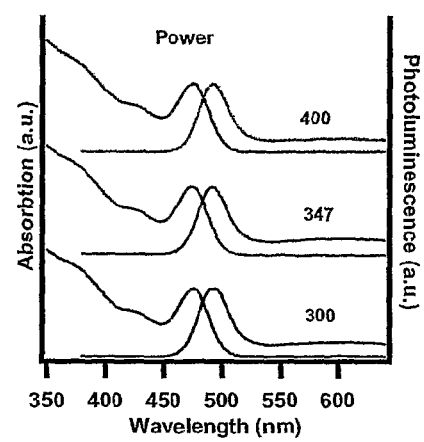

The influence of microwave power, reaction time, and reaction temperature is demonstrated for CdSe formed from $Li_4[Cd_{10}Se_4(SPh)_{16}]$ in FIGS. 9A-9C. In FIG. 9A the influence of varying time (0-55 min) at fixed power (400 W) and fixed temperature (300° C.) is investigated. In these graphs, one parameter is varied while the other two parameters (time, power, or temperature) remain constant. The variables at which the reactions were carried out are indicated next to the trace. The effect of increasing reaction times past 10 min is minimal with regards to size (2 nm), as evidenced by the position of the first exciton feature. A change in size distribution is observed for distribution for times longer than 45 min, as measured by PL shape and absorption bandwidth. Inspection of FIG. 9B shows that, at a fixed reaction time (40 min) and microwave power (400 W), a dependence of size on temperature is clearly observed. The nanoparticle size increases with increasing temperature. FIG. 9C demonstrates increasing the microwave power from 300 to 400 W for a reaction of 10 min at 210C does not have a marked effect on the nanomaterial size or the optical quality as measured by absorption excitonic features and photoluminescence. Lower powers are not presented due to the observation of slow heating rates, a difficulty in achieving the necessary reaction temperatures, and poor optical performance of the resultant materials.

The observation of small nanoparticles (~2 nm) even at high power, long reaction times, and high temperature is surprising, given that convective heating allows 9 nm CdSe nanocrystals to be isolated after several hours of reaction time. This may suggest that local minima may exist in the reaction trajectory for growth of nanocrystalline CdSe from the precursor methods that require long reaction times to overcome. Local minima along a reaction trajectory may arise even for reactions that are thermodynamically downhill to bulk but due to reconstruction or kinetics may be slow to progress over their transition state to the final product. In fact, surface reconstruction events may be coupled to surface passivation, as has been suggested previously.

The addition of an ionic liquid to a reaction can increase reaction temperatures due to their strong microwave cross-section, can stabilize transition-state species, and can act as catalyst towards growth. The observed heating rate differences in FIGS. 8A and 8B suggest that addition of ionic liquid to HDA in the formation of CdSe may increase the microscopic reaction temperature and in turn may influence nanoparticle growth. Addition of a strong microwave absorber to a reaction has been shown in microwave organic chemistry to increase the microscopic temperature of the reaction, overcome local minima, and push the reaction towards the thermodynamic product.

Figure 10:
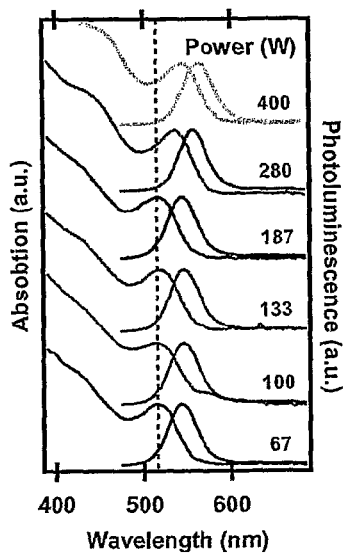
FIG. 10 graphs the power-dependent (W) size characteristics of CdSe nanoparticles formed by microwave heating with ionic liquid addition (1-hexyl-3-methylimidazolium).

In FIG. 10 the power-dependent (W) size characteristics of CdSe nanoparticles formed by microwave heating with ionic liquid addition (1-hexyl-3-methylimidazolium) are plotted. Here the applied power was increased from 160 to 400 W, keeping the reaction time at 3 min and the reaction temperature fixed at 210° C. It is clear that for CdSe nanoparticles grown in the presence of a 1.1 mol ratio of 1-hexyl-3-methylimidazolium chloride (IL) to the inorganic cluster, a large increase in nanoparticle size from 2 nm to greater than 5 nm in less than 10 min is observed. This is further shown in a direct comparison in FIGS. 11A-11C.

A plot of the nanoparticle size versus reaction condition (FIGS. 11A-11C) shows a dependence on time, temperature, and power in the presence of the ionic liquid. The QY was measured at RT in a thin path configuration using a 4 mm×10 mm quartz cuvette on a $10^{-8}$ M solution of the nanoparticle in toluene relative to Rhodamine R6G in ethanol at RT. At fixed temperature and time a steady growth is observed without a clear asymptote for size vs. power, suggesting that increasing power will increase size (FIG. 11A).

At fixed power and temperature (FIG. 11B), the nanoparticle approaches an asymptote at ~3.5 nm rapidly. At fixed power and time (FIG. 11C) the growth is slow to initiate at temperatures below 180° C. (3.0 nm), but shows steady growth between 180° C. and ~220° C. (5.5 nm). The lines in the figure provide a guide to the eye. It is clear that the addition of the IL results in a strong dependence on the reaction conditions, which was not previously observed. In addition the reaction rate is accelerated, suggesting that reaction barriers are overcome by heat transfer to the reactants mediated through the solvent or by displacing the amine passivating ligands, as has been observed when ODE is added as a non-passivant to lyothermal synthesis.

A plot of the change in QY with reaction condition appears in FIG. 12. The measured QY for the cluster grown materials is within experimental error as a function of power (56-64%), but not for time (20-52%) and temperature (28-70%). In all cases, the QYs are experimentally similar for a given size, and the observed variance with time and temperature may reflect the larger change in size for these conditions. It is important to note that the maximum QY obtained for the single-source materials for a core-only nanocrystal achieved a reproducible maximum value of ~70% for a 5.5 nm dot (FIG. 12(c)). Further changes in passivant and core-shelling would allow QYs to be obtained at the same level as the best reported materials to date. Owing to the high self-absorptivity of these materials, the QY measurements were conducted in thin path configurations, analogous to methods applied for high-efficiency laser dyes.

Strong microwave absorbers in a reaction can drastically accelerate the rate of material formation. This is very evident upon inspection of the synthesis of CdSe from CdO in TOPO. TOPO, which has a large static dipole, is a strong microwave absorber, as evidenced by the rapid heating rate observed in FIGS. 8A, 8B. FIG. 12 illustrates the growth of CdSe as a function of temperature in a microwave reactor at 300 W and a fixed power of 160 W. The CdSe nanomaterials have well-defined excitonic features and QYs on the order of 74%, consistent with the literature. More important, these materials are combined at 50° C. (to maintain reaction liquidity), require no high-temperature injection step, require no multiple injection for size focusing, and can be isolated within 30 sec of initiating the reaction regardless of the desired size. It is clearly observed that a very narrow size distribution is maintained throughout the reaction for all sizes with no PL defect emission.

InGaP Nanoparticle Formation. Formation of III-V materials is notorious for its difficulty and required long reaction times (h). Microwave heating has been shown to be advantageous in such cases. In organometallic reactions in the microwave, superheating of the solvent and vessel pressurization have been shown to give rise to a 1000-fold increase in reaction rate. It has also been observed that when the polarity of the solvent is decreased (i.e., when the solvent becomes more transparent) for some syntheses, the observed reaction rate and product yield increase. This implies that there is a stronger microwave-material interaction in the more transparent solvents giving rise to microwave-specific effects.

The formation characteristics for InGaP nanoparticles by microwave heating are compared between a high-boiling, non-coordinating solvent ODE and a low-boiling solvent decane. ODE and other alkane and alkene non-coordinating solvents provide an ideal reaction system to study the effects of microwave-material interaction owing to their relative transparency to the microwave field.

As seen in FIG. 13A, the formation of InGaP in ODE under constant temperature and power shows a focusing of size distribution with a reduction of size at longer reaction temperatures during a reaction time from 30 sec to 7 min. At 7 min, the size distribution and PL are maximized, when the applied power is 280 W and the reaction temperature is 280° C. With time, the onset of the first exciton and the quality of the PL becomes more resolved, with a final size of 4.0 nm. Inspection of the reaction at variable temperature (P=280 W, t=7 min, FIG. 14A) and variable power (T=280° C., t=7 min, FIG. 14B) suggests that while reaction temperature is critical for observing a clear excitonic feature (>280° C.), no effect on the excitonic feature is observed for power between 230 and 300 W/cm$^2$ with a fixed reaction temperature of 280° C. Inspection of the PL is more informative. The QY increases steadily with increasing applied power from a value <1% (P=230 W) to a value of 4% at 300 W in ODE. While this number is low compared to CdSe, it is on the order of QYs measured for thermally grown InP samples isolated from reaction. Following chemical etching in HF, the QY increases to a maximum value of 68% owing to removal of surface defects.

The influence of reaction pressurization on the rate of growth and quality of materials for InGaP nanocrystals is clearly observed in FIG. 13B. The same reaction carried out in decane rather than ODE produce astonishingly well-resolved excitonic features for InGaP of roughly the same size. It is clear that the size remains nearly constant and that the size distribution becomes focused around 1 min (FIG. 13B (2)) and remains constant up to 7 min. The PL quantum efficiency for the decane reaction ranges from 9% for a 30-s reaction to 15% for the 7-min reaction. This is believed to represent the first report of quantum efficiencies of a chemically non-etched, non-size-selected III-V system that exhibits quantum efficiencies of this magnitude.

Comparing the formation rate of InGaP in ODE and decane, it is apparent that the quality and rate is dramatically enhanced in decane. Chemical etching with HF produces QYs of the same level as the samples grown in ODE. This suggests that a reaction in superheated solvents overcomes local defect-driven minima in the reaction trajectory, producing more narrowly sized and optically better materials.

Although no size-dependent trends are observable for InGaP in either decane or ODE, the changes in the absorption features and the PL properties are indicative of particle annealing and size focusing. Different sizes of InGaP can be obtained by microwave methods, although the details do not appear to maintain the focus on the methodology rather than the specific material. Details on size dependence and optical properties of InGaP, InP, and InP/ZnS core shell prepared in the microwave are being studied. With increasing reaction temperature or applied power, the PL shows a loss of defect emission coupled to increased quantum efficiencies for the nanomaterials. These effects are more important in the ODE-grown materials, suggesting the reaction may be moderated by nanoparticle reconstruction or defect formation, such as vacancies or glide-plane defects influencing the growth of these materials.

Consistent with the experimental observations, at higher temperature or longer reaction times, particle annealing would be enhanced due to an increase in diffusion of the vacancies to the nanomaterial surface following a Boltzmann-dependent diffusion process and the expectation of defect migration by Fick's law toward the surface of the nanomaterial. In contrast to the material formed in ODE, decane appears to promote a stronger coupling of the microwave-nanomaterial interaction. This is seen in the superheated decane reaction compared with that of ODE (FIG. 13C). When the reaction containing decane approaches 200° C., the pressure increases rapidly until it is sustained at 6.2 atm for the duration of the reaction. It is observed from both reactions in ODE and decane that there is a rise in pressure at the onset of the reaction, suggesting that there is a volatile by-product that is liberated as the nanoparticle reaches its maximum size. This is possibly a low-boiling organic that diffuses back into solution when the reaction is cooled.

InP Nanoparticle Formation. The influence of vacancies, defects, and surface energies on nanomaterials surface is apparent when the reaction conditions required for formation of InGaP and InP are compared. The InP materials exhibit a significantly longer reaction time for a maximum in the PL quantum efficiency to be observed. For growth of InP in ODE, the optimum reaction time was found to be 15 min at 280° C. with an applied power of 280 W (FIG. 15A) without any additives. InP shows similar trends in material size distribution and optical quality with power, and temperature in analogy with the InGaP samples. The quantum efficiency of the as-prepared (non-HF-etched) InP material under optimal reaction condition is 4%, with a value of 38% following HF etching.

The drastic increase in reaction time suggests that the surface in InGaP more easily anneals than the binary system. This is not surprising in that a defect ion has been observed to increase reaction rates in II-VI materials. Alternatively, the enhanced rate for InGaP growth may be influenced by the formation of an In/Ga flux at the nanomaterial surface during the synthetic reaction. It has been suggested that InP grows at the interface of an $In^0$ droplet. In this case the In/Ga flux may lower the activation barriers in the reaction and the Ga would be expected to isolate at or near the nanoparticle surface. In fact, recent NMR and XPS studies suggest that the Ga isolates at or near the surface. Continuing studies to elucidate the growth mechanism in low boiling solvents and the influence of ionic liquids on the formation characteristics are ongoing.

Inspection of the influence of strong microwave absorbers (ILs and TOPO) on the growth of InP is a more complicated issue than for the II-VI materials, possibly owing to interactions of the IL with the precursors. The observations are dependent on the nature of the IL (imidazolium vs. phosphonium) and require further studies to fully elucidate the influence on the reaction mechanism on InP growth. In the presence of the 1-hexyl-3-methylimidazolium chloride IL, the nanomaterial precipitates to form an insoluble orange residue. This is presumably either a cluster or a small coordination complex, although clear identification of the product is still under investigation. When a phosphonium-based IL is added, such as trihexyltetradecylphosphonium decanoate or trihexyltetradecylphosphonium bromide, no precipitation is observed; however, the onset of the first exciton is shifted relative to the reaction carried out in the absence of the IL (FIG. 15B) and show no visible PL. The addition of TOPO results in a broadening of the absorption feature and has substantially lower quantum efficiency. In both additive cases (IL or TOPO) etching does not produce a substantial improvement of the PL performance over the reaction carried out in the absence of the additive. In addition, additives appear to broaden the size distribution. While additives have a marked effect on nanoparticle growth and quality, the effect is not advantageous in the III-V family. At this time the negative influence on quality would only be speculative in the absence of a well-understood reaction mechanism.

Conclusions. Dielectric heating is advantageous to the formation of nanocrystals. High operating powers and temperatures in the MW cavity allow nearly monodisperse high-quality nanomaterials with QYs up to 74% to be rapidly generated in under 20 min. The use of the microwave device eliminates thermal gradients by volumetric heating, eliminates the need for high-temperature injection for size focusing, and is scalable for commercialization. The influence of additives, power, temperature, and time is demonstrated for both the II-VI and III-V nanocrystalline systems. While the exact nature of the microwave-specific effect is difficult to define for these materials owing to their complex reaction trajectories, it is clear that the method can be tuned to optimize reaction conditions for specific materials. For instance, addition of ionic liquids that raise the rate of heating improves the growth rate for CdSe, while higher reaction pressures enhance the formation of III-V materials. This suggests that the nature of the transition states for growth in these systems is different and may be influenced by surface or defect formation.

The observed reaction rate enhancement and size focusing in nanocrystalline materials grown under dielectric heating conditions may arise from elevated reactant temperatures owing to selective heating coupled to rapid cooling through thermalization. Because in the microwave device the reactions are volumetrically heated, thermal gradients tend to be minimized, which results in a more uniform reaction. Selective heating arises from the relative differences in solvent and reactant dielectric constants. This means that the microscopic temperature substantially instantly rises when the microwave field is applied. The implication is that the internal temperature of the reaction at or near the nanoparticle surface is significantly higher than what is detected by the infrared detector, which ultimately reads the vessel temperature. Rapid thermalization to focus the nanoparticle size is achieved because of the high surface-to-volume ratio of nanoparticles below 7 nm coupled with the fact that they are colloidally suspended in solution. This tends to enhance the thermal field within the reaction matrix regardless of which direction the heat is transferred, either from particle to solvent or solvent to particle.

Experimental work also indicates that additives or pressurization can accelerate growth and suggests that vacancy, defect, or reconstruction processes can influence the growth behavior of these materials along the reaction trajectory. This synthetic strategy can be tailored to a host of nanomaterials to enhance the efficiency of the nanomaterial discovery and the optimization of nanostructured materials. Moreover, the III-V nanomaterials and the harsh environment and high temperatures needed for growth are no longer limiting factors governing the industrial scalability of such materials. The ability to control the reaction with microwaves offers a more environmental approach to colloidal semiconducting nanoparticles. The microwave techniques disclosed herein are useful for effectively automating the synthetic process, and provide evidence for the efficacy of a continuous-flow microwave reactor for nanoparticle formation.

In the foregoing description, certain terms have been used for brevity, clarity, and understanding, but no unnecessary limitations are to be implied therefrom beyond the requirements of the prior art, because such words are used for description purposes herein and are intended to be broadly construed. Moreover, the embodiments of the apparatus illustrated and described herein are by way of example, and the scope of the invention is not limited to the exact details of construction.

What is claimed is:

1. A method for producing a crystalline nanoparticle semiconductor material comprising the steps of:
    mixing a precursor for a desired semiconductor material in a solvent to form a reaction mixture;
    subjecting the reaction mixture to microwave dielectric heating such that the solvent is superheated; and
    and permitting a growth-phase reaction to proceed, wherein nanoparticles of the desired semiconductor material are formed in the heated reaction mixture.

2. The method recited in claim 1, further comprising the step of quenching the reaction to substantially terminate nanoparticle formation.

3. The method recited in claim 1, wherein the desired semiconductor material is selected from a group consisting of CdSe, InP, InGaP, InN, InGaN, LiZnN, LiZnP, $(In,Ga)_2O_3$, $In_2O_3$, $Ga_2O_3$, nano-diamond, and carbon nanotubes.

4. The method recited in claim 1, wherein the precursor is selected from a first group consisting of a group-12 and a group-13 organometallic precursor, and a second group consisting of a group-15 and a group-16 reactant.

5. The method recited in claim 1, further comprising the step, preceding the subjecting step, of adding an additive comprising at least one of tri-octyl phosphine oxide (TOPO) and an ionic liquid to the reaction mixture.

6. The method recited in claim 5, wherein the precursor comprises $Li_4[Cd_{10}Se_4(SPh)_{16}]$, the desired semiconductor material comprises CdSe, and the solvent comprises TOPO, and further comprising the step of adding an ionic liquid to the reaction mixture.

7. The method recited in claim 6, wherein the ionic liquid comprises 1-hexyl-3-methylimidazolium chloride.

8. The method recited in claim 5, wherein the precursor comprises CdO and tri-butylphosphine selenide and the desired semiconductor material comprises CdSe, the solvent comprises TOPO, and the ionic liquid comprises 1-hexyl-3-methylimidazolium chloride.

9. The method recited in claim 1, wherein the precursor comprises indium (III) acetate and gallium (III) 2,4-pentanedionate, the desired semiconductor material comprises InGaP, and the solvent comprises hexadecanoic acid and octadecene, and further comprising the steps of:
    heating the reaction mixture under vacuum to a non-superheated level;
    cooling the reaction mixture following the heating step;
    adding tris(trimethylsilyl)phosphine to the cooled reaction mixture prior to the subjecting step; and
    actively cooling the reaction mixture following the subjecting step.

10. The method recited in claim 1, wherein the desired semiconductor material comprises InGaP, and further comprising the steps of:
    mixing indium (III) acetate, gallium (III) 2,4-pentanedionate, and hexadecanoic acid to form the reaction mixture;
    heating the reaction mixture under reduced pressure to a nonsuperheated level prior to the subjecting step;
    cooling the heated reaction mixture prior to the subjecting step;
    adding decane to the cooled reaction mixture; and
    adding tris(trimethylsilyl)phosphine to the cooled reaction mixture plus decane prior to the subjecting step.

11. The method recited in claim 1, wherein the solvent comprises a high boiling-point solvent.

12. The method recited in claim 1, wherein the subjecting step comprises placing the reaction mixture in a focused, single-mode, high-power microwave oven.

13. The method recited in claim 12, wherein the microwave oven comprises a Teflon insert.

14. The method recited in claim 12, further comprising the step, prior to the subjecting step, of placing the reaction mixture in a sealed reaction vessel.

15. The method recited in claim 12, further comprising the step, during the subjecting step, of cooling a cavity of the microwave oven to remove latent heat therefrom.

16. The method recited in claim 12, wherein the superheating temperature comprises approximately 300° C.

17. The method recited in claim 1, further comprising the step of isolating the formed nanoparticles.

18. The method recited in claim 17, wherein the: isolating step is performed under an argon atmosphere using the steps of:
    a. dissolving the reaction mixture in toluene;
    b. adding an anhydrous butanol/methanol solution to the reaction mixture to induce nanoparticle precipitation;
    c. centrifuging the reaction mixture; and
    d. collecting the nanoparticles from the precipitate in the centrifuged reaction mixture.

19. The method recited in claim 18, further comprising repeating steps a-d a plurality of times.

20. The method recited in claim 1, wherein an initiation of the subjecting step is carried out at a microwave power of about 400 W.

21. The method recited in claim 20, wherein a phase following the initiation of the subjecting step is carried out at varied power and temperature in order to maximize a quality of the nanoparticles.

22. A method for producing a crystalline nanoparticle semiconductor material comprising the steps of:
    mixing a precursor for a desired semiconductor material in an alkane solvent in a sealed reaction vessel to form a reaction mixture;
    subjecting the reaction mixture to microwave dielectric heating at sufficient power to heat the solvent above a boiling point of the solvent but without causing the solvent to boil;
    and permitting a growth-phase reaction to proceed, wherein nanoparticles of the desired semiconductor material are formed in the heated reaction mixture.

23. The method of claim 22, wherein the alkane solvent is decane.

* * * * *

UNITED STATES PATENT AND TRADEMARK OFFICE
CERTIFICATE OF CORRECTION

PATENT NO. : 8,414,746 B2
APPLICATION NO. : 11/997022
DATED : April 9, 2013
INVENTOR(S) : Geoffrey F. Strouse et al.

Page 1 of 1

It is certified that error appears in the above-identified patent and that said Letters Patent is hereby corrected as shown below:

In the Claims

Column 17, Line 30: Cancel the word "and."

Signed and Sealed this
Thirtieth Day of July, 2013

Teresa Stanek Rea
*Acting Director of the United States Patent and Trademark Office*